(12) United States Patent
Etcheberry et al.

(10) Patent No.: US 9,514,961 B2
(45) Date of Patent: Dec. 6, 2016

(54) METHOD FOR CHEMICALLY PASSIVATING A SURFACE OF A PRODUCT MADE OF A III-V SEMICONDUCTOR MATERIAL AND THE PRODUCT OBTAINED BY SUCH A METHOD

(75) Inventors: Arnaud Etcheberry, Colombes (FR); Anne-Marie Goncalves, Marly le Roi (FR); Charles Mathieu, Bonnelles (FR); Jacky Vigneron, Vernouillet (FR); Nicolas Mézailles, Saint Maurice Montcouronne (FR); Pascal Le Floch, Versailles Cédex (FR); Francoise Hervagault, legal representative, Orsay (FR); Élaine Le Floch, legal representative, Orsay (FR); Clémence Le Floch, legal representative, Orsay (FR); Paul Le Floch, legal representative, Orsay (FR)

(73) Assignees: CENTRE NATIONAL DE LA RECHERCHE SCIENTIFIQUE—CNRS, Paris (FR); ECOLE POLYTECHNIQUE, Palaiseau (FR); UNIVERSITE VERSAILLES SAINT-QUENTIN-EN-YVELINES, Versailles (FR)

( * ) Notice: Subject to any disclaimer, the term of this patent is extended or adjusted under 35 U.S.C. 154(b) by 0 days.

(21) Appl. No.: 14/126,217

(22) PCT Filed: Jun. 12, 2012
(Under 37 CFR 1.47)

(86) PCT No.: PCT/FR2012/051310
§ 371 (c)(1),
(2), (4) Date: Oct. 30, 2014

(87) PCT Pub. No.: WO2012/172247
PCT Pub. Date: Dec. 20, 2012

(65) Prior Publication Data
US 2015/0108617 A1  Apr. 23, 2015

(30) Foreign Application Priority Data
Jun. 14, 2011 (FR) ...................................... 11 55157

(51) Int. Cl.
*H01L 21/322* (2006.01)
*H01L 21/02* (2006.01)
(Continued)

(52) U.S. Cl.
CPC ..... *H01L 21/3228* (2013.01); *H01L 21/02118* (2013.01); *H01L 21/02282* (2013.01);
(Continued)

(58) Field of Classification Search
CPC ............ H01L 21/3228; H01L 21/02118; H01L 21/02323; H01L 29/0607; H01L 21/306; H01L 21/02282
See application file for complete search history.

(56) References Cited

U.S. PATENT DOCUMENTS 4,107,108 A * 8/1978 Dieck .................. C08G 79/025
260/DIG. 24
4,789,748 A * 12/1988 Jen ......................... H01B 1/127
549/3

(Continued)

FOREIGN PATENT DOCUMENTS

FR    2825513 A1    12/2002
JP    S63-194339    8/1988
(Continued)

OTHER PUBLICATIONS

Goncalves et al. ("Fully Protective yet Functionalizable Momolayer on InP" Chem. Mater. 2010, 22, 3114-3120).*
(Continued)

*Primary Examiner* — Marc Armand
*Assistant Examiner* — Sue Tang
(74) *Attorney, Agent, or Firm* — Miller, Matthias & Hull LLP

(57) ABSTRACT

A method for chemically passivating a surface of a product made of a III-V semiconductor material in which a) a P(N) polymer film is formed by deposition in a solvent comprising liquid ammonia. The film is formed by deposition, without electrochemical assistance, in the solvent, in the presence of an oxidizing chemical additive comprising phosphorous and generating electrical charge carriers in said surface.

10 Claims, 2 Drawing Sheets

(51) Int. Cl.
    *H01L 21/306*    (2006.01)
    *H01L 29/06*    (2006.01)

(52) U.S. Cl.
    CPC ...... *H01L 21/02323* (2013.01); *H01L 21/306* (2013.01); *H01L 29/0607* (2013.01)

(56) References Cited

U.S. PATENT DOCUMENTS

| | | | |
|---|---|---|---|
| 5,008,169 A * | 4/1991 | Yu | G03G 5/076 |
| | | | 430/123.43 |
| 5,266,830 A | 11/1993 | Sato | |
| 6,284,317 B1 | 9/2001 | Laibinis et al. | |
| 2002/0182840 A1 | 12/2002 | Lorans et al. | |
| 2007/0207186 A1 * | 9/2007 | Scanlon | A61F 2/07 |
| | | | 424/424 |
| 2008/0095816 A1 * | 4/2008 | Gordy | A61L 27/26 |
| | | | 424/422 |
| 2008/0193662 A1 * | 8/2008 | Dornbusch | B05D 7/16 |
| | | | 427/435 |

FOREIGN PATENT DOCUMENTS

| | | |
|---|---|---|
| JP | H01-045149 | 2/1989 |
| JP | H02-293471 | 10/1990 |
| JP | H04-091436 | 3/1992 |
| JP | H04-355928 | 12/1992 |
| JP | H05-102128 | 4/1993 |
| JP | H04-049621 | 3/1995 |
| JP | H09-183855 | 7/1997 |
| JP | H10-106961 | 4/1998 |

OTHER PUBLICATIONS

Gonvalves, et al.; *Fully Protective Yet Functionalizable Monolayer on InP*; Jan. 5, 2010; University of Versailles; American Chemical Society; pp. 2-12.
Li et al; CVD *Groth and Properties of "Phoslon" Dielecfric Films*; Feb. 1986: IBM Generaly Technology Division, New York; pp. 2-8.
Hirota, et al; *Chemical vapor deposition and characterization of phosphorus nitride (P3N5) gate insulators for inP metal-insulator-semiconductor devices*; Journal of Applied Physics; 1982; pp. 2-9.
Yoshitaka Furukawa; *Chemical Vapor Deposition of insulting Films Using Nitrogen Triflouride*; pp. 376-377; Dec. 26, 1983.
Office Action for related Japanese Application No. 2014-515257; action mailed Jun. 20, 2016.

* cited by examiner

METHOD FOR CHEMICALLY PASSIVATING A SURFACE OF A PRODUCT MADE OF A III-V SEMICONDUCTOR MATERIAL AND THE PRODUCT OBTAINED BY SUCH A METHOD

CROSS-REFERENCE TO RELATED APPLICATIONS

This application is a 35 USC §371 U.S. national stage filing of International Patent Application No. PCT/FR2012/051310 filed on Jun. 12, 2012, and claims priority under the Paris Convention to French Patent Application No. FR 11 55157 filed on Jun. 14, 2011.

FIELD OF THE DISCLOSURE

The present invention concerns methods for chemically passivating a surface of a product made of a III-V semiconductor material and the products obtained by such methods.

BACKGROUND OF THE DISCLOSURE

More specifically, the invention concerns a method for chemically passivating a surface of a product made of a III-V semiconductor material in which a) a P,N polymer film is formed on said surface by deposition in a solvent comprising liquid ammonia.

The article, "Fully Protective yet Functionalizable Monolayer on InP," by Gonçalves et al., in *Chemistry of Materials* 22 (2010), 3114-3120, describes an example of such a method, in which a polyphosphazene film is deposited and has been shown to be very satisfactory. In effect, the passivation of the surface obtained by this method can be of high quality.

However, the film is formed with electrochemical assistance, which presents practical drawbacks that prevent the implementation of such a method on an industrial scale. Consequently, it is sought to simplify the production of such films.

SUMMARY OF THE DISCLOSURE

To that end, a method of the type in question is characterized in that said film is formed by deposition, without electrochemical assistance, in said solvent, in the presence of an oxidizing chemical additive comprising phosphorous and generating electrical charge carriers in said surface.

Concerning deposition "without electrochemical assistance", we can also speak of "open-circuit potential" deposition.

Surprisingly, it was found that the addition of such an additive comprising phosphorous in the solvent could be used to bring about the formation of a polyphosphazene-type film without electrochemical assistance. In this way, the complex operations needed for electrochemical methods, such as having to establish a connection for polarization, were eliminated. Additionally, we obtain an ultra-thin cover film.

Moreover, in preferred embodiments of the invention, we could have recourse to either of the following features:
for step a), we make use of dipping;
the "V" material is phosphorous;
the "III" material is indium;
step a) simultaneously comprises dissolution of the surface semiconductor material, oxidation of the solvent, and formation of a monomer equivalent of polyphosphazene;

step a) takes place between −40° C. and −100° C.;
step a) takes place with an additive concentration comprised between 0.1 and 3 millimoles per liter (mM/L);
we introduce, before step a), a step b) involving deoxidation of at least a portion of said surface;
step b) is implemented for only a portion of the surface;
the method also comprises, after step a), a step c) involving washing of a surface passivated in step a);
said additive is $PCl_5$.

According to another aspect of the invention, it also concerns a product comprising:
a III-V semiconductor material substrate presenting a surface,
a P,N polymer film formed on said surface,
characterized in that said film presents, during x-ray photoelectron spectrometry (XPS), for $N_{1S}$, a spectrum having a first peak for a high binding energy and a second peak for a low binding energy, the first peak having an amplitude at least 20% greater than the second peak.

Other characteristics and advantages of the invention will appear from the following description of one of its embodiments, which is purely non-limiting, for which the attached drawings are provided.

BRIEF DESCRIPTION OF THE DRAWINGS

In the drawings.

In the different figures, the same reference numbers refer to identical or similar elements.

DETAILED DESCRIPTION OF THE DISCLOSURE

Figure 1:
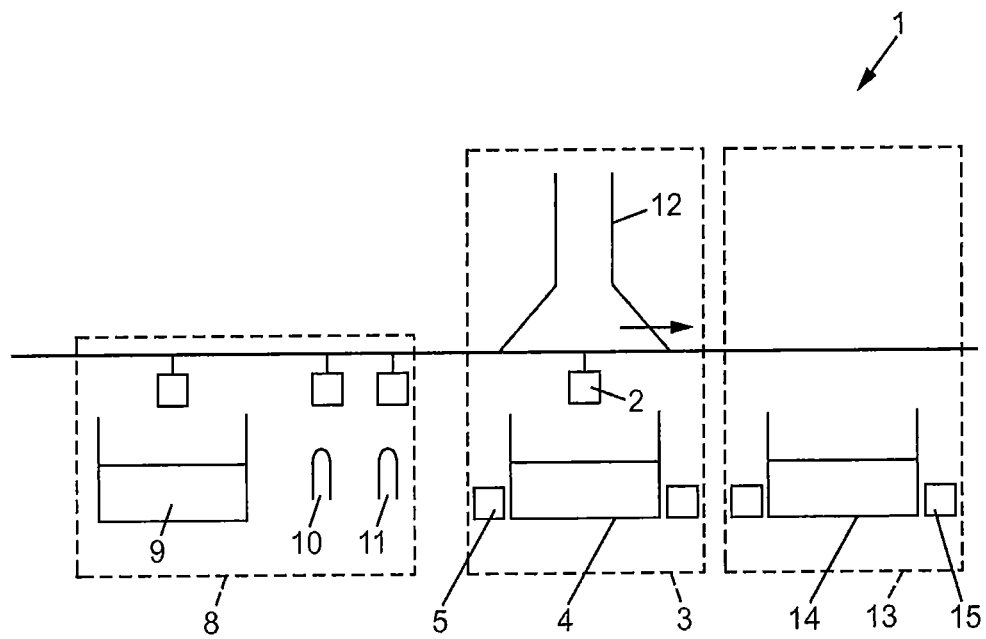
FIG. 1 is a schematic view of an installation for implementing a method according to an embodiment.
Figure 2A:
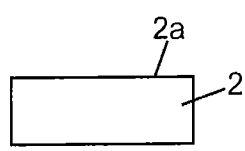
FIG. 2a is a cutaway view of a product according to a first embodiment before application of the method.

FIG. 1 is a schematic view representing an installation 1 for passivation of the surface of a product made from a III-V semiconductor material. An example of the product is shown in FIG. 2a. Product 2 is formed of a III-V semiconductor material. It is made from one or more elements in column "III" of the periodic table of elements (notably indium) and one or more elements from column "V" of the periodic table of elements (notably antimony or phosphorous). For example, the material considered is indium phosphide, InP. Product 2 comprises a surface 2a, which we seek to passivate.

As shown in FIG. 1, installation 21 comprises passivation apparatus 3. This comprises a recipient 4, containing a liquid solvent. For example, the solvent in question consists of liquid ammonia, $NH_3$. Apparatus 3 also comprises temperature regulating means 5, such as a cryostat, suitable for maintaining the ammonia in the liquid state.

Product 2 is placed in the solvent in the presence of an additive. This additive is capable of oxidizing the III-V semiconductor material in said solvent. In particular, we employ an oxidizer:
that comprises phosphorous,
that is compatible with the liquid ammonia solvent,
that can generate electrical charge carriers (holes) in surface 2a of product 2.

A particular example of such an additive is phosphorous pentachloride ($PCl_5$).

For example, we use as a solvent liquid ammonia obtained by simple expansion in an open glass liquefaction cell kept at a temperature of −78° C. through the use of a refrigerant bath (for example, acetone filled with dry ice), confined in a Dewar flask. Alternatively, we could also work in a cryostat maintained between −40° C. and −100° C., preferably between −50° C. and −70° C., or in any other type of refrigerating container that can maintain a constant temperature in the above range. The liquid ammonia can be used in its neutral form, that is, totally pure, or acidic (for example, by introducing $NH_4Cl$ or Br at a concentration of 0.1 moles per liter of solvent).

Figure 2B:
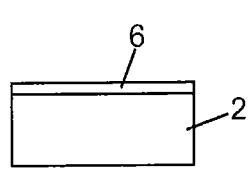
FIG. 2b is a corresponding view of 2a following application of the method.

For the III-V semiconductor material oxidizing additive, we use $PCl_5$. The latter is introduced after weighing and put in solution using the standard method at a concentration of 1 to 3 millimoles per liter of solvent. If necessary, we can use lower concentrations of PCl5, for example, on the order of 0.1 to 1 millimoles per liter. The conditions are combined for deposition, without electrochemical assistance, of a polyphosphazene type P,N polymer film 6 on surface 2a of product 2 (see FIG. 2b).

In general, polyphosphazene is a polymer of type (—RR'P=N—)$_n$, where the R,R' substituents are generally alkoxy, amino, $R_2N$ or halogens.

In the present case, we propose that the mechanism (in its electrochemical version) on which the reaction is based can be written, in the case of indium phosphide:

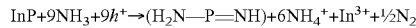

$$InP + 9NH_3 + 9h^+ \rightarrow (H_2N-P=NH) + 6NH_4^+ + In^{3+} + \tfrac{1}{2}N_2$$

This equation incorporates three phenomena of the mechanism leading to passivation:
dissolution of the material at the nanometric scale,
oxidation of the solvent, and
obtention of an equivalent monomer.

These together generate the continuous coating of surface 2a, which creates the phenomenon of self-regulation through the limiting factor of coverage. In terms of roughness, this self-regulation maintains a final state that is very similar to the initial state, which excludes unwanted parasitic morphological disturbances in an optical configuration.

$PCl_5$ can be used to inject recoverable charge carriers in the surface to initiate a production mechanism for a polyphosphazene-type P,N polymer film similar to the mechanism described above in the electrochemical version. Additionally, this component is compatible with liquid ammonia.

The method is carried out entirely without electrochemical assistance ("electroless"), thereby enabling a surface film to be created without making use of the obligatory, complex contacting steps used for known electrochemical assistance methods.

Figure 3A:
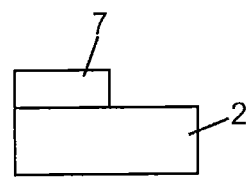
FIGS. 3a and 3b are corresponding views, respectively, of FIGS. 2a and 2b for a product according to a second embodiment.
Figure 3B:
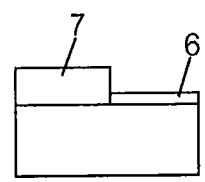

The method described above is also compatible with the typical masking methods used for components of this type. As described, for example, in FIG. 3a, product 2 carries mask 7 on its surface, for example, a mask of the $Si_3N_4$, $SiO_2$, ZnS type, or a polymer compatible with liquid ammonia. In these cases, as shown in FIG. 3b, passivation film 6 is formed uniquely on a portion of the product surface. In a variant, mask 7 could be formed of an oxide of the III-V material of product 2. In effect, the oxides, in particular those of InP or GaP, are perfectly stable in liquid ammonia, even in the presence of $PCl_5$.

For example, if we do not want such an oxide to interfere with the formation of passivation film 6, installation 1 can also comprise deoxidation unit 8 upstream of passivation apparatus 3 itself. Thus, sample 2 first undergoes the deoxidation process before undergoing formation of the polyphosphazene-type film. For an example of a deoxidation method, we can, for example, dip the sample in deoxidizing solution 9, typically 1M HCl in ultrapure water for several minutes, followed by rinsing 10 with ultrapure water, and drying 11, for example, under an argon or nitrogen stream.

In this embodiment, the sample thus treated is immediately introduced into the liquid ammonia solution for passivation.

The method is, thus, especially compatible with the other industrial steps for the production of III-V semiconductor components.

After the step involving formation of a passivation film, we can also make use of an extraction step. For example, the cradle with the sample is rapidly withdrawn from treatment bath 4, simply beneath exhaust hood 12. We can then proceed to washing step 13, for example, by plunging the sample into bath 14 of ultrapure ammonia. This step can continue or even be used for intermediate storage prior to final extraction. Final extraction occurs, for example, by a gradual increase of the temperature of the sample, maintained in its cradle, by means of temperature regulation device 15. The processed sample is then stored in a conventional support for a semiconductor wafer.

Figure 4:
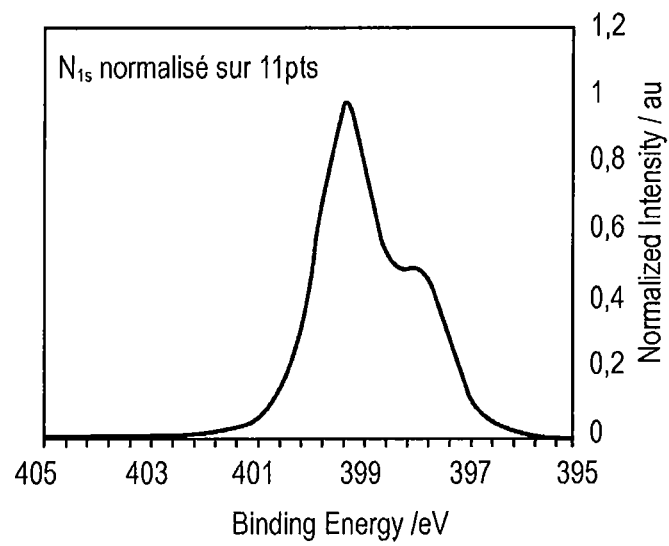
FIG. 4 is a representative x-ray photoelectron spectrometry (XPS) curve for $N_{1S}$ for a product obtained by the above method.
Figure 4A:
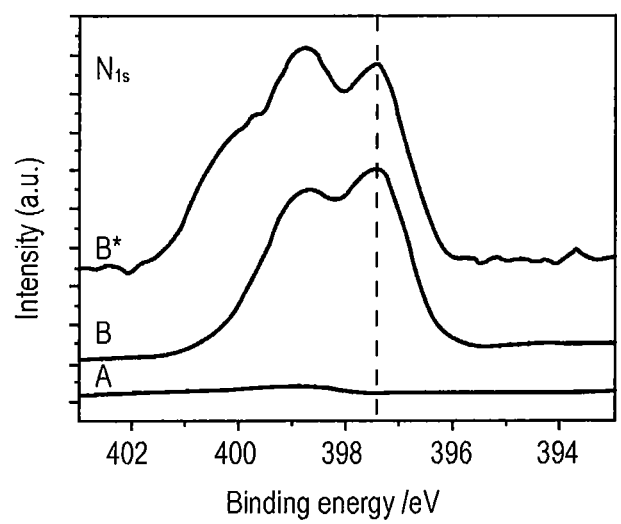
FIG. 4a is a curve similar to the curve shown in FIG. 4 for products obtained by methods involving electrochemical assistance.

It has elsewhere been observed that the P,N polymer film obtained without electrochemical assistance by the method described above is different from the polyphosphazene film obtained by methods involving electrochemical assistance found in the prior art. We can speak of a "polyphosphazene-type film" to the extent that it presents characteristics similar to polyphosphazene films without, however, being identical. In particular, the XPS photoelectronic spectrometry measurement associated with $N_{1S}$ presents significant differences, as shown in FIG. 4, in the method without electrochemical assistance described above and in FIG. 4a for the prior electrochemical method. In FIG. 4a, relative to the $N_{1A}$ response of InP samples, curve A corresponds to a recently deoxidized InP surface, curve B is obtained after anodic treatment with electrochemical assistance in liquid ammonia and storage in air for at least one year, and curve B* is obtained by adding a step involving immersion for 16 hours in a deoxygenated aqueous solution of $K_2PtCl_4$ (3 millimoles per liter) following the two steps of the method corresponding to curve B (this step induces a reaction of amine groups on the passivated surface with $PtCl_4^{2-}$ and acts as a developer (see the publication referred to below)). As can be seen, in particular, in FIG. 4, based on normalized intensity in arbitrary units, the spectrum presents a first peak with a binding energy equal to 399 electron volts and a second peak with a binding energy equal to 398 electron volts. The amplitude of the first peak (the highest binding energy) is clearly greater than that of the second peak (at least 20% greater), and this is easily reproducible. This spectrum characterizes the film obtained by the method described above and suggests a considerable surface order for one of the chemical environments of nitrogen in the film. By peak, we mean that the curve of intensity as a function of energy presents a maximum between an increasing part and a decreasing part. In comparison, we note that, for the electrolytic methods of FIG. 4a, the spectrum presents two principal peaks with similar amplitudes.

Moreover, the film formed is very thin, which is demonstrated by the set of XPS data.

Therefore, we can consider an XPS spectrum measurement such as this to be a signature of the anelectrolytic implementation of the method of forming a polyphosphazene-type film.

The present description has been given principally with respect to indium phosphide (InP). It is presumed that the principles upon which the invention is based apply equally to other III-P materials, when all the precautions necessary for the use of another III-P material have been taken. In particular, we presume that the implementation of the above method with a gallium phosphide-type (GaP) material is possible.

The invention claimed is:

1. A method for chemically passivating a surface of a product made of a III-P semiconductor material in which a) a polyphosphazene polymer film is formed on said surface by reaction between said III-P semiconductor material and a solvent comprising liquid ammonia,
   wherein said film is formed, without electrochemical assistance, in the presence of an oxidizing chemical additive comprising phosphorous and generating electrical charge carriers in said surface.

2. The method according to claim 1, in which, for step a), we make use of dipping.

3. The method according to claim 1, in which the "III" material is indium.

4. The method according to claim 1, in which step a) simultaneously comprises dissolution of the surface semiconductor material, oxidation of the solvent, and formation of a monomer equivalent of polyphosphazene.

5. The method according to claim 1, in which step a) is implemented between −40° C. and −100° C.

6. The method according to claim 1, in which step a) is implemented with an additive concentration comprised between 0.1 and 3 millimoles per liter (mM/L).

7. The method according to claim 1, in which we implement, before step a), a step b) involving deoxidation of at least one portion of said surface.

8. The method according to claim 7, in which step b) is implemented only for a portion of the surface.

9. The method according to claim 1, also comprising, after step a), a step c) involving washing of a surface passivated in step a).

10. The method according to claim 1, in which said additive is PCl5.

* * * * *